United States Patent [19]
Komarek

[11] 3,935,474
[45] Jan. 27, 1976

[54] PHASE LOGIC
[75] Inventor: James A. Komarek, Newport Beach, Calif.
[73] Assignee: Hycom Incorporated, Irvine, Calif.
[22] Filed: Mar. 13, 1974
[21] Appl. No.: 450,826

[52] U.S. Cl. ............... 307/205; 307/214; 307/215; 307/221 C; 307/224 C
[51] Int. Cl.² ................ H03K 19/08; H03K 19/36; H03K 19/40; G11C 19/28
[58] Field of Search .......... 307/205, 214, 215, 218, 307/221 C, 224 C, 269

[56] References Cited
UNITED STATES PATENTS

| | | | |
|---|---|---|---|
| 3,461,312 | 8/1969 | Farber et al. | 307/221 C |
| 3,518,451 | 6/1970 | Booher | 307/205 X |
| 3,524,077 | 8/1970 | Kaufman | 307/205 X |
| 3,526,783 | 9/1970 | Booher | 307/205 |
| 3,551,692 | 12/1970 | Yen | 307/221 C X |
| 3,588,528 | 6/1971 | Terman | 307/221 C |
| 3,617,767 | 11/1971 | Booher | 307/251 X |
| 3,638,036 | 1/1972 | Zimbelmann | 307/205 |
| 3,648,066 | 3/1972 | Terman | 307/208 X |
| 3,651,334 | 3/1972 | Thompson et al. | 307/279 X |
| 3,747,064 | 7/1973 | Thompson | 307/205 |

OTHER PUBLICATIONS
Long, "Dynamic Logic Circuit Family", IBM Tech. Discl. Bull., Vol. 16, No. 5, pp. 1560, 10/1973.

West, *Practical Circuit Design Using M.D.S.*, Design Electronics (pub.), pp. 30–32,37,38, 3/1971.

Yao, "Dynamic Shift Register Cyclic Encoder", IBM Tech. Discl. Bull., Vol. 12, No. 11, pp. 1936–1938, 4/1970.

*Primary Examiner*—Stanley D. Miller, Jr.
*Assistant Examiner*—L. N. Anagnos
*Attorney, Agent, or Firm*—Gordon L. Peterson

[57] ABSTRACT

In a logic cell, a plurality of gates are serially connected and responsive to signals on a plurality of conductors to perform a particular logic function. The gates are responsive to subsystem clock signals which control the operation of the gates to delay the output of the logic cell. The cell includes at least one ratioless gate, and at least one ratioed gate. The ratioless gates provide high speed and reduced size, while the ratioed gates provide low noise characteristics. In combination, the ratioed gates, which provide strong output signals, make excellent drivers for the ratioless gates which are particularly adapted to accommodate complex logic networks.

16 Claims, 9 Drawing Figures

PHASE LOGIC

BACKGROUND OF THE INVENTION

1. Field of the Invention

This invention relates generally to MOS logic networks which use multi-phase clock circuits in ratioed and ratioless configurations.

2. Description of the Prior Art

MOS logic networks are basically of two types, static logic networks and dynamic logic networks. MOS static networks are similar to the type of logic networks employed in bipolar integrated circuits in that they do not rely upon inherent capacitances for the storage of charges. Rather, they include gates which are either conductive or nonconductive depending on the particular logic state.

The timing of MOS static logic networks is typically accomplished by shifting data with series coupling devices and dc flip-flops. Although such static logic circuits provide generally good noise immunity and rapid conversion to MOS-LSI with minimum redesign, they suffer from extremely high power requirements. Also, they generally require a larger number of devices per logic function and permit fewer logic functions per array.

Dynamic logic networks use multiphase clock signals in both ratioed and ratioless configurations. A fundamental characteristic of a dynamic logic network is that it uses load devices which are clocked on and off synchronously as a function of system or subsystem timing. Inherent capacitance is used for the temporary storage of charge to retain information in the logic networks. Dynamic logic networks consume less power and require less chip area per logic function than do the static logic networks. In addition, the delay function can be mechanized with few devices and system timing problems can also be simplified.

Two schemes of dynamic logic dominate in custom circuit design. These schemes are a two-phase ratioed logic scheme and a four-phase ratioless logic scheme. The number of phases in a particular scheme connotes the number of logic levels which can be implemented in a single bit time.

In ratioed logic schemes generally, when both the load and input devices are conducting, there is a dc current path from the power or clock supply to ground. This provides the high power dissipation properties which are characteristic of these rotioed circuits. Also, larger device geometries are needed to implement a given logic function than with the ratioless schemes. Furthermore, the number of series logic gates which can be reasonably accommodated is restricted by an impedance ratio requirement wherein the impedance of the load device is preferably at least 20 times the total impedance of all the series input devices. Although the two-phase rotioed logic networks are slower, they are generally preferred since they provide for simple noise analysis. Also, they are much less complex than typical four-phase networks since they use two clocks instead of four clocks.

If noise can be analyzed properly, it is generally felt that the four-phase ratioless logic scheme provides a better logic network than does the two-phase ratioed logic scheme. Since there are no ratio requirements to be met, the circuits can be formed from generally smaller unit sized transistors. Also, power consumption is significantly reduced in spite of the fact that the four clocks in the four-phase ratioless scheme draw more dynamic current than the two clocks in the two-phase ratioed scheme. However, in the four-phase ratioless logic network, noise can be critical and noise analysis can be quite difficult.

The four-phase schemes typically include logic gate types which are connected in series or parallel to form logic cells or networks. Each of the gate types in the series typically drives one or more of the other gate types in the same cell or even another cell. The use of ratioless gate types in such a network has caused several problems that are of particular interest to the present invention.

One such problem will be referred to herein as a capacitance sharing problem. In some four-phase ratioless logic networks and all two-phase ratioless logic networks, there is a sharing of capacitance charge between the output node and the internal node during the evaluation mode.

If the inherent capacitances associated with the output and internal nodes are substantially equal, the charge on the output node will be reduced to approximately one-half the charge initially provided by a particular gate type. Since the logic value of the gate is dependent upon the charge on the output node, any noise associated with a subsequent gate may further reduce the charge on the output node and result in an erroneous evaluation of the logic state of the gate.

Another problem associated with the ratioless logic schemes is commonly referred to as a negative noise problem. If a particular gate type in the cell or network is driven by the preceding gate type and the precharge on the particular gate type is high or true, a large amount of inherent capacitance coupling will pull the output of the preceding gate type negative as the output of the particular gate type logically changes to low or false.

Another more serious problem associated with most 4-stage ratioless schemes is positive noise. If a particular gate is driven by a preceding gate in the network and the particular gate is precharged low or false, a significant amount of inherent capacitance coupling will pull the output of the preceding gate positive as the output of the particular gate is charged positive or true. Since most MOS FET processes provide less of a safety margin against positive noise than against negative noise, this can be a particularly serious problem.

SUMMARY OF THE INVENTION

In accordance with the present invention, at least one ratioless gate type and at least one ratioed gate type are provided in a four phase-two clock scheme. In this scheme there is no capacitance sharing problem such as that experienced in the two and four phase ratioless scheme of the prior art. Furhermore, the ratioless gate types permit logic complexity not available in the ratioed logic schemes. Also, there is a significant power savings over the two-phase ratioed scheme. Of course the use of two clocks rather than four considerably simplifies clock overlap problems and provides a significant savings in chip area. Speed is significantly greater than in the two-phase ratioed scheme and all complex logic can be performed in the low power ratioless gate types. Noise in the present scheme is held at a minimum, and the ratioless gates which are more susceptible to noise, experience only the less serious negative type of noise.

One advantage of particular importance to the present invention is the provision of a ratioed gate type for driving a ratioless gate type. The ratioed gate type does not suffer from the capacitance sharing problem so its charge provides an output signal of high magnitude. Such a signal is particularly desirable at the output of any gate which is used to drive another gate. The negative noise problem associated with the ratioless gate is less of a problem when the driving gate type provides a strong output signal.

The present invention also includes the combination of a ratioed gate type driven by a ratioless gate type. Even though many of the ratioless gate types suffer from the capacitance sharing problem, in the present invention there is no negative noise problem associated with the following ratioed gate type. In the absence of the negative noise, the lesser output signal of the ratioless gate type can be accurately evaluated. Additionally, the particularly complex logic employing several series logic transistors can be accommodated in the ratioless gate types which do not suffer from the impedance ratio problem of the ratioed gate types.

Due primarily to the presence of the ratioless gate types in the logic cells of the present invention, there is a significant power savings and an increase in speed over the two-phase ratioed scheme of the prior art.

These and other features and advantages of the present invention will become more apparent with a description of preferred embodiments taken in conjunction with the associated drawings.

DESCRIPTION OF PREFERRED EMBODIMENTS

Figure 1:
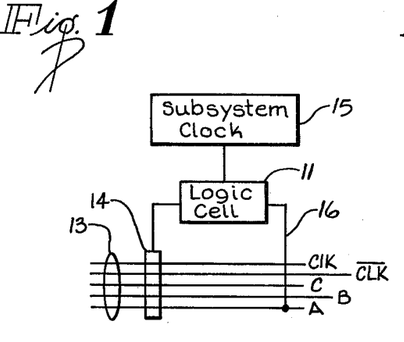
FIG. 1 is a block diagram of a logic cell responsive to a subsystem clock and a plurality of signals to perform a particular logic function.

The present invention is concerned primarily with networks or cells which are used in a system to perform various logic functions. One such logic cell is shown in block diagram form in FIG. 1 and designated by reference number 11. Such a system including the cell 11 will typically have a plurality of conductors 13 which may form a bus in the system. A network 14, which may actually form a portion of the logic associated with the cell 11, is provided to sample the signals on the conductors 13 and to introduce the signals to the logic cell 11. These signals may include a system clock signal (Clk), a signal A, a signal B, and a signal C, as illustrated in FIG. 1. In response to these signals, the logic cell 11 provides an output signal having known logic characteristics, for example $A = B \cdot C + A \cdot \bar{C}$. This output signal is typically introduced on an output conductor 16 to one of the conductors 13 to alter the characteristics of one of the signals, such as the signal A.

Typically the logic cell 11 will also perform a delay function so that the output signal of the cell 11 is provided only after a number of clock periods have elapsed since the introduction of the signals to the cell 11. This delay function results primarily from control of the logic cell 11 by at least one subsystem clock 15.

Figure 1A:
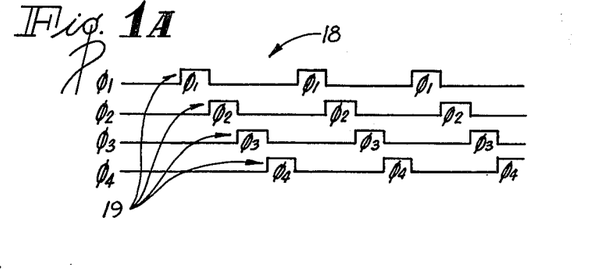
FIG. 1A illustrates a plurality of clock signals which can be provided by the subsystem clock illustrated in FIG. 1.

In the most complex logic schemes, the subsystem clock 15 will divide the system clock signal (Clk) to provide four clock signals such as those illustrated generally at 18 in FIG. 1A. Each of these subsystem clock signals 18 will typically have pulses 19 occurring at the same frequency in each of the signals 18 but in differing phase relationships. These phase relationships give rise to the common designation of the subsystem clock signals as $\phi_1$, $\phi_2$, $\phi 3$ and $\phi_4$. This common designation will be used herein not only to reference the respective subsystem clock signals 18 but also to designate the times associated with the pulses 19 in the respective signals 18. For example, the time during which a pulse occurs in the subsystem clock signal $\phi_2$ will be referred to as the time $\phi_2$.

To best illustrate the advantages of the logic cell 11 of the present invention, it will be helpful to discuss the problems associated with typical cells which are presently being used in custom circuit design. One cell of the prior art which uses a logic scheme commonly referred to as two-phase ratioed logic is illustrated in FIG. 2.

Figure 2:
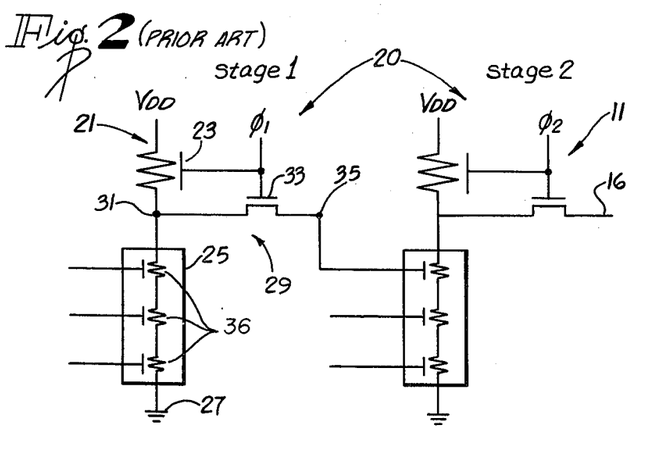
FIG. 2 is a block diagram of a particular logic cell representative of an impedance ratio problem associated with the prior art.

The logic cell 11 will typically include at least one logic stage such as the stages designated Stage 1 and Stage 2 in FIG. 2. Each of the stages includes a circuit, commonly referred to as a gate 20, which performs a known logic function in accordance with variable circuit parameters. The gate 20 typically includes a logic branch 21 including a load transistor 23 connected in series with a logic block 25. In ratioed logic schemes the logic branch 21 of the gate 20 is commonly connected between a power supply $V_{DD}$ and a reference potential such as ground 27.

The gate 20 also typically includes an output branch 29 which is connected to a terminal 31 which is common to both the transistor 23 and the block 25. In a ratioed logic scheme, such as that illustrated in FIG. 2, the output branch 29 will commonly include an output transistor 33. Both the load transistor 23 and the output transistor 33 may be enabled by one of the subsystem clock signals such as the signal $\phi_1$. The logic block 25 will typically include a plurality of logic transistors 36 which may be connected in a series relationship as shown in Stage 1 of FIG. 2.

A characteristic of ratioed circuits is that when both the load transistor 23 and the logic transistors 25 are conducting, there is a dc current path from the source or operating potential $V_{DD}$ to ground 27. Proper operation of a ratioed logic gate depends on the ratio of the onimpedance of the load transistor 23 to the combined onimpedances of the logic transistors 36. Typically the impedance of the load transistor 23 must be at least twenty times as great as the combined impedances of the logic transistors 36. If this impedance ratio is not maintained, a low voltage signal at the terminal 31 may be raised to indicate an erroneous true logic state. The importance of this impedance ratio is emphasized by the common designation of this type of gate as a ratioed gate.

Operation of the two-phase ratioed cell illustrated in FIG. 2 proceeds in the following manner. At the time $\phi_1$, the subsystem clock signal $\phi_1$ will enable the load transistor 23. Depending upon the state of the logic transistors 36 in the block 25, this will provide a signal on the terminal 31 of either substantially $V_{DD}$ or substantially ground. Thus, if the logic transistors 36 are conductive, the terminal 31 will be maintained at a potential of substantially ground. However, if the transistors 36 are nonconductive, the terminal 31 will be isolated from the ground 27 and will therefore have a potential of substantially $V_{DD}$. It can now be seen that the logic branch 21 in Stage 1 of FIG. 2 functions much as a voltage divider. Therefore, in order to provide the terminal 31 with a low logic state, the voltage drop to ground 27 must be significantly less than the voltage drop to the power source $V_{DD}$.

The signal $\phi_1$ can also be used to enable the output transistor 33 so that the signal on the terminal 31 is immediately introduced to an output terminal 35. The output signal, with characteristics dependent upon the state of the logic in the block 25, will drift at the output terminal 35 after the time $\phi_1$. The output signal on the terminal 35 is typically used to control the logic in the logic block of the following stage, such as Stage 2.

At the time $\phi_2$, the load transistor and the output transistor in Stage 2 can be enabled. The logic in the logic block of Stage 2 is set in accordance with the signal on the output terminal 35 of the gate 20 in Stage 1. In the manner previously discussed, Stage 2 develops an additional logic signal which is introduced on the conductor 16 at the output of the logic cell 11.

The gates in the various stages of cell 11 are sometimes referred to with reference to the particular phase during which the associated gate is in the evaluation mode. Ratioed gates are further designated with a lower case r. Thus the gate illustrated in Stage 1 of FIG. 2 might be referred to as a type 1r gate while the gate illustrated in Stage 2 of FIG. 2 might be referred to as a type 2r gate.

Figure 3:
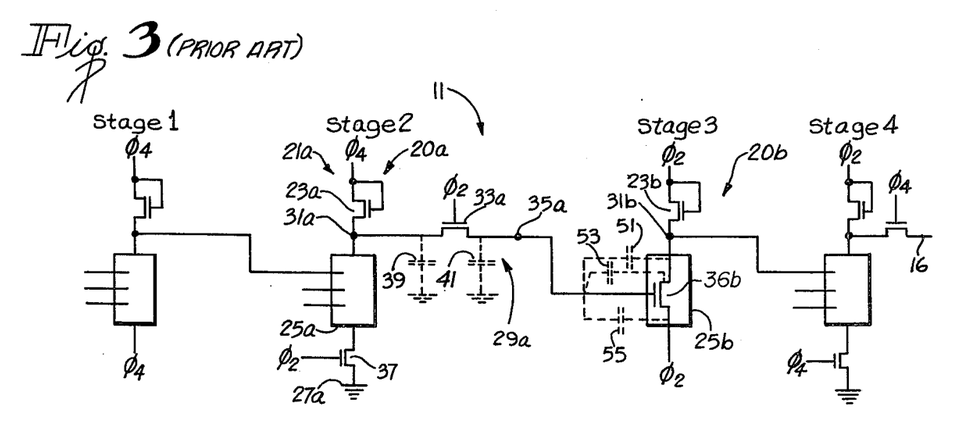
FIG. 3 is a block diagram of another logic cell representative of a capacitance sharing problem and a noise problem associated with the prior art.

Another cell of the prior art is that illustrated in FIG. 3 and commonly referred to as a four phase-two clock ratioless cell. Although the number of stages is typically indicative of the number of subsystem clocks used, it will be noted in this four stage cell 11 that only two clock signals $\phi_2$ and $\phi_4$ are used.

With reference to Stage 2 of FIG. 3 it will be noted that many of the characteristics of the ratioless gates are similar to those of the ratioed gates illustrated in FIG. 2. For this reason elements which perform similar functions will be designated with the same reference numeral, followed by a lower case letter. Thus, the cell 11 in FIG. 3 includes a pair of gates 20a and 20b in Stages 2 and 3 respectively. The gate 20a includes an output branch 29a and a logic branch 21a including a transistor 23a connected in series with a logic block 25a.

The logic branch 21a differs from the logic branch 21 in FIG. 2 in several important respects. The branch 21a is responsive to the subsystem clock signal $\phi_4$ rather than the source of operating potential $V_{DD}$. Also, the transistor 23a is enabled by the clock signal $\phi_4$. As a point of further distinction, it will be noted that the logic branch 21a includes an isolation transistor 37 which is connected between the block 25a and the reference potential such as ground 27a. The isolation transistor 37 is enabled by the clock signal $\phi_2$.

These differences are of particular importance to the ratioless gates such as those illustrated in FIG. 3. For example, it will be noted that since the transisor 23a is enabled by the clock signal $\phi_4$ and since the isolation transistor 37 is enabled by the clock signal $\phi_2$, there is never a direct current path through the transistor 23a and the logic block 25a. For this reason the ratioless gates consume considerably less power than do the ratioed gates.

The gates 20a and 20b in the stages of FIG. 3. do not rely upon the maintenance of an impedance ratio between the transistor 23a and the logic transistors in the block 25a. This feature gives rise to the designation of this type of gate as a ratioless gate. Whereas the ratioed gates 20 use the voltage divider principle to produce a logic level, the ratioless gates 20a and 20b employ a conditional capacitor discharge to provide the desired logic state. This enables the use of relatively small transistors in the logic branch 21a and additionally permits more logic to be placed in a given chip area. Since there are no impedance restrictions associated with the logic block 25a, the ratioless gates can accommodate particularly complex logic networks.

The output branch 29a illustrated in Stage 2 of FIG. 3 is connected to an internal terminal 31a which is common to the transistor 23a and the logic block 25a. The output branch 29a also includes an output terminal 35a and an output transistor 33a which is disposed between the terminals 31a and 35a. In this particular embodiment, the output transistor 33a is activated by the clock signal $\phi_2$. Capacitances which are inherent in the gate 20a at the terminals 31a and 35a are illustrated by the dotted capacitors 39 and 41 respectively.

Ratioless gates such as the gates 20a and 20b typically have three sequential modes of operation:

precharge — the internal terminal 31a of the gate is charged;

evaluate — the capacitance of the internal terminal 31a is conditionally discharged as a function of the logic in the logic block 25a; and hold — the gate holds the charge resulting from the evaluation mode.

These modes of operation can best be understood with a discussion of the typical operation of the gate illustrated in Stage 2 of FIG. 3. At the time $\phi_4$, the clock signal $\phi_4$ activates the transistor 23a to enable the precharging of the capacitor 39 associated with the internal terminal 31a. At the time $\phi_2$, the isolation transistor 37 is enabled to provide a conduction path from the internal terminal 31a, through the logic block 25a, to ground 27a. At this time, $\phi_2$, the logic in the block 25a evaluates the state of the previous logic stage, in this case Stage 1. If the logic in the block 25a provides a closed circuit path to ground 27a, the precharged signal on the terminal 31a will be reduced to a low logic state.

Also at the time $\phi_2$, the output transistor 33a is enabled so that the charge on the capacitor 39 is shared with the capacitor 41. It is this charge on the capacitor 41 which is held on the output terminal 35a during the hold mode of the gate 20a.

The sharing of the charge between the capacitor 39 and the capacitor 41 is a considerable problem to this type of ratioless gate. This capacitance sharing problem can be better understood with reference to FIG. 4 which illustrates a pair of signals 38 and 40 indicative of the charge on the capacitors 39 and 41 respectively at the times associated with the clock signals $\phi_2$ and $\phi_4$. At the time $\phi_4$, the capacitor 39 is precharged to a level dependent upon the magnitude of the pulse in the clock signal $\phi_4$. This precharge is illustrated by the vertical line 42. At this time a charge does not occur on the capacitor 41 due to the isolation provided by the output transistor 33a. After the time $\phi_4$, the charge on the capacitor 39 drifts as shown by the substantially horizontal line 43.

When the clocking pulse appears in the signal $\phi_2$, the output transistor 33a is enabled to permit the charges on the capacitor 39 to be shared with the capacitor 41. If the capacitance values of the capacitors 39 and 41 are substantially equal, the charge on the capacitor 39 will be reduced to approximately $V_{DD}/2$ and the charge on the capacitor 41 will be increased to substantially $V_{DD}/2$. Of course the degree of charge shared will depend upon the values of the capacitors 39 and 41 which will vary in different embodiments of the invention. It is the charge on the capacitor 41 which appears on the output terminal 35a and which is evaluated by the gate in the following stage. It can be appreciated that an output signal of approximately half strength is more susceptible to noise and is therefore less effective in driving the following stage. Ratioless gates of the type illustrated in Stages 1 and 3 of FIG. 3 do not include output transistors, such as the transistor 33a, and therefore do not suffer from the capacitance sharing problem.

Stage 3 of FIG. 3 is illustrated to include a transistor 23b connected in series with a logic block 25b. A terminal 31b common to the transistor 23b and the logic block 25b provides the output terminal of this particular gate. The terminal 31b is initially precharged by the clock signal $\phi_2$ which is enabled through the transistor 23b by the same clock signal $\phi_2$. In this particular gate 20b the logic block 25b is terminated at the same clock signal $\phi_2$. Since both the transistor 23b and the logic block 25b conduct to the same clock $\phi_2$ there is never a dc current path from the clock supply $\phi_2$ to ground and the gate 20b is therefore a ratioless gate.

The logic block 25b is this stage is illustrated to include a single logic transistor 36b. Although there may be many transistors in a single logic block, the single transistor 36b is sufficient to illustrate the type of inherent capacitances which may be associated with a logic transistor. These inherent capacitances typically include a source-to-gate capacitance 51, a channel-to-gate capacitance 53, and a drain-to-gate capacitance 55.

Noise can be a particular problem in ratioless gates if the precharge on the internal terminal 31b is discharged through the logic transistor 36b. This can result in an erroneous evaluation of the charge on the output terminal 35a of the preceding gate 20a.

Figure 4:
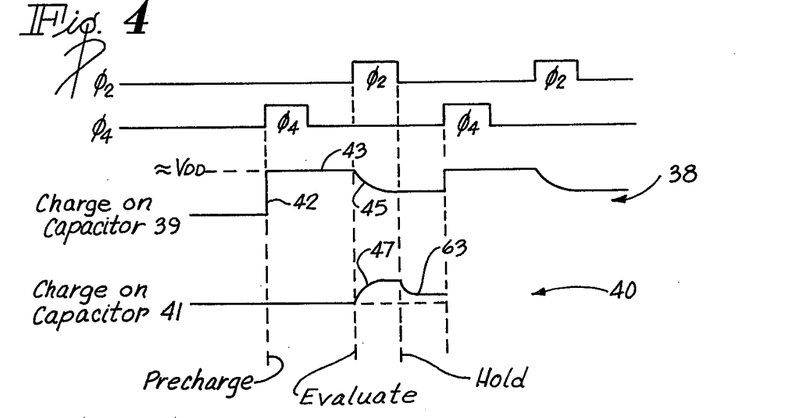
FIG. 4 illustrates a pair of the subsystem clock signals and a pair of wave forms showing the capacitance sharing problem characteristic of some of the logic cells of the prior art.

When the gate 20b in Stage 3 is in the evaluation mode, during the time $\phi_3$, the precharge on the terminal 31b may be passing through the logic block 25b depending upon the state of the logic transistor 36b. If the clock signal $\phi_2$ includes positive pulses, the terminal 31b will be precharged to a positive level and when $\phi_2$ falls to a ground potential, this positive charge may flow to the ground potential through the transistor 36b. This negative going transition will produce negative noise due to the presence of the inherent capacitances 51, 53 and 55. This negative noise may further depress the charge on the output terminal 35a of the gate 20a in Stage 2. The effect of this negative noise is illustrated in FIG. 4 by the line 63.

In another implementation, the logic in a particular network may have served to discharge the internal terminal 31b of a particular gate. At the time when the pulse in the timing signal $\phi_2$ begins, the clock signal $\phi_2$ will become positive and will result in a positive charging of the terminal 31b through the logic transistor, such as transistor 36b. This will result in positive noise due to the presence of the inherent capacitance associated with the logic transistor 36b. If the logic state of the output terminal 35a is a logic ZERO, this positive noise may raise the signal level so that it is evaluated as a logic ONE. This erroneous logic state caused by positive noise would result in the erroneous enabling of the logic transistor 36b in a particular gate. Since an erroneous state can be produced by a lesser quantity of positive noise than negative noise, the positive noise is usually of greater concern.

Figure 5:
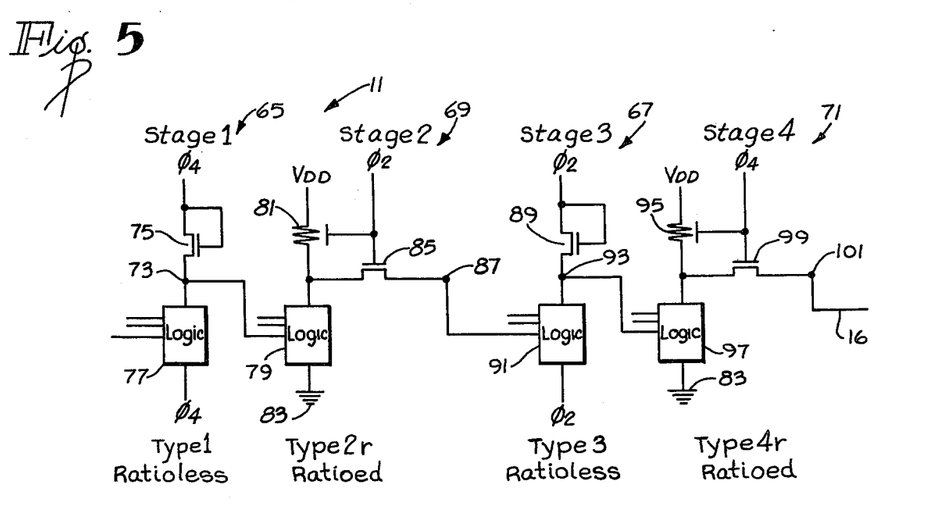
FIG. 5 is a block diagram of a logic cell of the present invention.

FIG. 5 illustrates a preferred embodiment of the cell 11 of the present invention. This cell 11 includes at least one ratioless gate, such as the gates 65 and 67 and at least one ratioed gate such as the gates 69 and 71. In this particular cell 11, the ratioless gate 65 in Stage 1 is responsive to the clock signal $\phi_4$ to enable the precharging of an output terminal 73 through a transistor 75. The output terminal 73 is connected through a logic block 77 to the clock signal $\phi_4$. When the clock signal $\phi_4$ achieves a ground potential, the precharge on the output terminal 73 may be discharged depending upon the state of the logic in the block 77. The resulting signal on the output terminal 73 is then held for evaluation by the gate 69 in Stage 2.

The gate 69 is a ratioed gate responsive to a power supply, $V_{DD}$, and also to the clock signal $\phi_2$. A logic block 79 is connected in series with a load transistor 81 between the power supply $V_{DD}$ and a reference potential, such as ground 83. At the time $\phi_2$, both the load transistor 81 and an output transistor 85 are enabled by the clock signal $\phi_2$. Depending upon the state of the logic in the block 79, which in turn may be dependent upon the charge on the output terminal 73 of the gate 65, a signal is produced by the gate 69 and immediately introduced to an output terminal 87. The signal on the output terminal 87 is then held for evaluation by the gate 67 in Stage 3.

The ratioless gate 67 is similar to the gate 65 in Stage 1 in that it includes a load transistor 89 and a logic block 91. The gate 67 is different than the gate 65 in that it is responsive to the clock signal $\phi_2$ to precharge an output terminal 93. During the time $\phi_3$ when the clock signal $\phi_2$ is at ground potential, the charge on the output terminal 93 may be discharged through the block 91 depending upon the state of the logic in the block 91 which in turn may be dependent upon the charge on the output terminal 87 of the gate 69. The resulting charge on the output terminal 93 is held for evaluation by the gate 71 in Stage 4.

The gate 71 is similar to the gate 69 in that it includes a load transistor 95 and a logic block 97 connected in series between the power supply $V_{DD}$ and the reference potential such as ground 83. The gate 71 also includes an output transistor 99. At the time $\phi_4$, the load transistor 95 and the output transistor 99 are both enabled, and depending upon the state of the logic in the block 97 an output terminal 101 is charged to provide the output signal of the cell 11.

In this particular embodiment it will be noted that the ratioless gates 65 and 67 are of the type which do not include an output transistor such as the transistor 33a in Stage 2 of FIG. 3. These gates 65 and 67 therefore do not suffer from the capacitance sharing problem discussed with reference to FIG. 3. Nonetheless, the ratioless gates 65 and 67 provide the cell 11 of this invention with the advantages of speed and small size. Furthermore, the logic blocks 77 and 91 can include very complex logic structures since the ratioless gates do not depend upon impedance ratios to produce a logic signal.

The ratioed gates 69 and 71 also provide the cell 11 of this invention with particularly desirable characteristics. Even though these gates 69 and 71 have output transistors 85 and 99 respectively, there is no sharing of capacitor charge such as that noted with reference to the ratioless gate 20a in Stage 2 of FIG. 3. Thus the signal on the output terminals 87 and 101 are substantially equal in magnitude to the power supply voltage, $V_{DD}$. This provides a strong output signal which is particularly desirable for driving subsequent stages in the same cell 11 or the stages of other cells in the logic network.

A strong output signal, such as that provided by the ratioed gate 69, is of particular advantage when it is used to drive a ratioless gate, such as the gate 67. The negative noise discussed with reference to Stage 3 of FIG. 3 which is typical of some ratioless gates is of less significance when the preceding stage provides a strong output signal. Furthermore, in this particular embodiment of the cell 11, this noise is of the negative type which is less detrimetnal than noise of the positive type for the reasons previously discussed.

Figure 6:
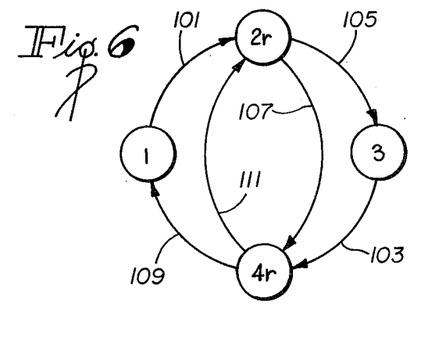
FIG. 6 is a compatibility chart for the cell illustrated in FIG. 5.

Any gate in a hold mode can be used to drive another gate which is simultaneously in an evaluate mode. FIG. 6 illustrates a compatibility chart wherein the encircled numbers correspond to the gate types shown in the block diagram of FIG. 5. The arrows in FIG. 6 indicate which gates can be used to drive other gates in the cell 11. For example, the gate type 1 can be used to drive only the gate type 2r as shown by the arrow 101. Similarly, the gate type 3 can be used to drive only the gate type 4r as shown by the arrow 103. The remaining gates, type 2r and 4r are commonly referred to as major gates, since they can be used to drive at least two of the other gates in the cell 11. For example, the gate type 2r can be used to drive the gate type 3 and the gate type 4r as shown by the arrows 105 and 107, respectively. Similarly, the gate type 4r can be used to drive the gate type 1 as shown by the arrow 109 and the gate type 2r as shown by the arrow 111.

Figure 7:
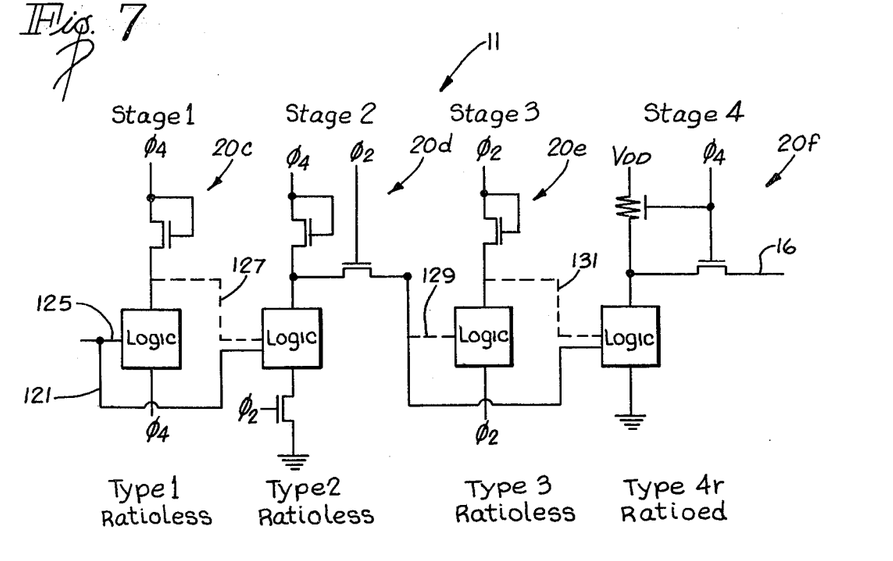
FIG. 7 is a further embodiment of the logic cell of the present invention.

This compatibility of major and minor gate types can be of particular advantage as further illustrated in the embodiment of FIG. 7. In this embodiment, the cell 11 includes the gates designated by the reference numerals 20c, 20d, 20e, and 20f, in the respective Stages 1 through 4. It will be noted that in this embodiment the gates 20c, 20d, and 20e are ratioless gates while the gate 20f is a type 4r ratioed gate.

Figure 8:
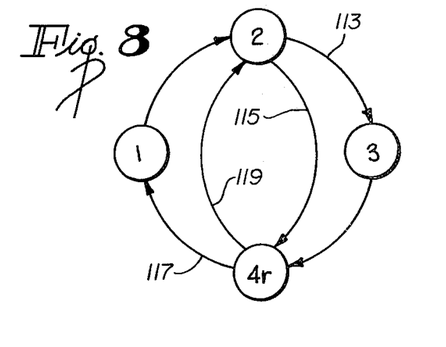
FIG. 8 is a compatibility chart for the logic cell illustrated in FIG. 7.

FIG. 8 illustrates the compatibility chart for the cell 11 as shown in FIG. 7. It will be noted that the gate type 2 and the gate type 4r are the major gates in this particular embodiment. In other words, the gate type 2 can be used to drive either the gate type 3 or the gate type 4r as shown by the arrows 113 and 115, respectively. Similarly, the gate type 4r can be used to drive not only the gate type 1 but also the gate type 2 as shown by the arrows 117 and 119, respectively.

Referring again to FIG. 7, it will be noted that the cells 20c, 20d, 20e, and 20f can be connected so that the minor cells, type 3 and type 1, can be bypassed. Thus the input to the cell 11 which is substantially the output of Stage 4 can be connected through a conductor 121 to drive Stage 2. Similarly, the output of the gate 20d in Stage 2 can be connected through a conductor 123 to drive the gate 20f in Stage 4. With the minor gates bypassed, the cell in FIG. 7 will operate by following the lines 115 and 117 in the compatibility chart illustrated in FIG. 8.

If the logic is sufficiently complex that additional gates are needed, the conductors 121 and 123 may be eliminated and the gates in the Stages 1 through 4 can be sequentially connected. The input to the cell 11 can be used to drive Stage 1 as shown by the line 125, and the output of Stage 1 can be used to drive Stage 2 as shown by the dotted line 127. The output of Stage 2 can be used to drive Stage 3 as shown by the dotted line 129 and the output of Stage 3 can be used to drive Stage 4 as shown by the dotted line 131.

In the embodiment of FIG. 7, the only ratioed gate is the gate 20f provided in the final stage. This placement of the ratioed gate is desirable since it provides the cell 11 with a particularly strong output signal. The advantages associated with speed, size and logic complexity are retained in the initial stages with the provision of ratioless gates 20c, 20d and 20e. As far as compatibility is concerned, a single ratioed gate could function with equal advantage in any of the Stages 1, 2 and 3.

There are several advantages associated with the combination of ratioless and ratioed gate types in a single cell 11. Where a ratioed gate is used to drive a ratioless gate, such as in Stages 2 and 3 of FIG. 5, the strong output signal provided by the ratioed gate is of particular advantage for driving the following stage. This strong output signal is less susceptible to the noise problems typically associated with the ratioless gates. The most complex logic structures in the cell 11 can be grouped in those logic blocks associated with the ratioless gates, since these gates do not suffer from the impedance ratio requirements of the ratioed gates.

Where a ratioless gate is used to drive a ratioed gate, such as in the Stages 1 and 2 of FIG. 5, there are also significant advantages. Even though the ratioless gates may provide output signals of reduced strength, due to the capacitance sharing problem, the following ratioed gates do not provide for capacitor discharge through the logic block during the evaluation mode. For this reason noise is less of a problem in the ratioed gate and the output signal of reduced strength from the ratioless gate is of less concern.

Although the invention has been described with reference to specific embodiments and cells including combinations of particular types of gates, it will be understood by those skilled in the art that other combinations of ratioed and ratioless gates can provide many of the advantages associated with the present invention. Additionally, in a single logic network, there may be many logic cells each having one or more stages performing a logic function. Although a particular stage may be driven by the preceding stage in the associated cell, it may also be driven by a stage associated with another cell of the network. Furthermore, although in the embodiments described, the transistors have been asssumed to contain n-channel material so that the positive state corresponds to a logic ONE, it will be understood by those skilled in the art that the invention can also be embodied using transistors formed from p-channel material in which case a negative state corresponds to the logic ONE. This calls for a simple reversal of polarity of charge and voltage. For this reason, the scope of the invention should be ascertained only with reference to the following claims.

I claim:

1. A logic cell comprising:
   first and second ratioed gates, each of said ratioed gates including a logic block and an impedance means coupled to the logic block, each of said logic blocks being coupled to a reference potential whereby the impedance means and the logic block can serve as a voltage divider and the state of the logic block affects the potential at a location between the impedance means and the logic block;
   each of said first and second ratioed gates including an output switch coupled to said location of the associated ratioed gate to form a junction at said location;
   a ratioless gate including a logic block, a switch coupled to the logic block, and a location between the switch and the logic block;
   means for coupling the output switch of the first ratioed gate to an input of the logic block of the ratioless gate;
   means for coupling said location of the ratioless gate to an input of the logic block of said second ratioed gate to form a junction at said location of the ratioless gate;
   means for providing first and second clock signals with each of said clock signals having a predetermined phase relationship relative to the other;
   said output switch of said first ratioed gate including means responsive to the first clock signal to control the output switch of said first ratioed gate;
   said output switch of said second ratioed gate including means responsive to the second clock signal to control the output switch of the second ratioed gate; and
   said switch of said ratioless gate including means responsive to the first clock signal to control said switch of said ratioless gate.

2. A logic cell as defined in claim 1 wherein said ratioless gate is a first ratioless gate, said logic cell including a second ratioless gate and means for coupling the second ratioless gate to an input of the logic block of the first ratioed gate whereby the second ratioless gate provides an input signal to the first ratioed gate.

3. A logic cell as defined in claim 2 wherein said second ratioless gate includes a logic block and a switch coupled to the logic block, said switch of said second ratioless gate including means responsive to the second clock signal to control said switch of said second ratioless gate.

4. A logic cell as defined in claim 1 including means for coupling the side of said logic block of said ratioless gate remote from the junction of said first ratioless gate to receive said first clock signal.

5. A logic cell comprising:
   a plurality of gates coupled so that the output of one of the gates provides an input signal for another of the gates;
   said plurality of gates including first and second ratioless gates, each of said first and second ratioless gates including a logic block, a switch coupled to the logic block, and a location between the switch and the logic block;
   said plurality of gates including a ratioed gate, said ratioed gate including a logic block, impedance means coupled to the logic block, and a location between the impedance and the logic block, said logic block of said ratioed gate being adapted to be coupled to a reference potential whereby the impedance means and the logic block of the ratioed gate serve as a voltage divider and the state of the logic block of the ratioed gate affects the potential at said location of said ratioed gate;
   said ratioed gate including an output switch coupled to said location of said ratioed gate to form a junction at said location of the ratioed gate;
   means for coupling the location of said first ratioless gate to an input of the logic block of said ratioed gate to form a junction at said location of the first ratioless gate;
   means for coupling the output switch of said ratioed gate to an input of the logic block of said second ratioless gate;
   clock means for providing first and second clock signals with each of said clock signals having a predetermined phase relationship relative to the other;
   means for coupling said clock means to said switch of said first ratioless gate so that the first clock signal can control said switch of said first ratioless gate;
   means for coupling said clock means to the output switch of said ratioed gate whereby the second clock signal can control said output switch of said ratioed gate; and
   means for coupling said clock means to the switch of said second ratioless gate whereby one of said first and second clock signals can control the switch of said second ratioless gate.

6. A logic cell as defined in claim 5 wherein said one clock signal is said second clock signal.

7. A logic cell as defined in claim 6 including means for coupling the side of said logic block of said first ratioless gate remote from the junction of said first ratioless gate to said clock means to receive said first clock signal.

8. A logic cell comprising:
   a first ratioless gate including a logic block, a switch coupled to the logic block, and a location between the switch and the logic block;
   a ratioed gate including a logic block, impedance means coupled to the logic block, and a location between the impedance means and the logic block, said logic block of said ratioed gate being adapted to be coupled to a reference potential whereby the impedance means and the logic block of said ratioed gate can serve as a voltage divider and the state of the logic block of the ratioed gate affects the potential at said location of the ratioed gate;
   each of said first ratioless gate and said ratioed gate including an output switch coupled to the location of the associated gate to form a junction at said location of the associated gate;
   means for coupling the output switch of said first ratioless gate to an input of the logic block of said ratioed gate;
   means for coupling the output switch of the ratioed gate to an input of the logic block of said first ratioless gate;

clock means for providing first and second clock signals with each of said clock signals having a predetermined phase relationship relative to the other;

means for coupling the output switch of said first ratioless gate to said clock means so that the first clock signal can control said output switch of said first ratioless gate; and means for coupling the output switch of said ratioed gate to said clock means so that the second clock signal can control the output switch of said ratioed gate.

9. A logic cell as defined in claim 8 wherein said first ratioless gate includes a branch between the logic block thereof and a reference potential, said branch including a first switch, and means for coupling said first switch to said clock means so that the first clock signal can control the state of said first switch.

10. A logic cell as defined in claim 8 wherein said means for coupling the junction of the first ratioless gate to the logic block of said ratioed gate includes a second ratioless gate.

11. A logic cell as defined in claim 8 wherein said means for coupling the junction of said ratioed gate to the logic block of said first ratioless gate includes a second ratioless gate.

12. A logic cell comprising:
a plurality of gates;
first means for coupling said gates together;
said plurality of gates including first and second ratioless gates, each of said first and second ratioless gates including a logic block, a first switch coupled to the logic block, and a location between the first switch and the logic block;
said first means including means for coupling the location of the first ratioless gate to an input of the logic block of the second ratioless gate;
one of said ratioless gates including an output switch coupled to the location of said one ratioless gate;
said plurality of gates including at least one ratioed gate, said ratioed gate including a logic block, impedance means coupled to the logic block, and a location between the impedance means and the logic block, said logic block of said ratioed gate being adapted to be coupled to a reference potential whereby said impedance means and the logic block of the ratioed gate can serve as a voltage divider and the state of the logic block of the ratioed gate affects the potential at said location of the ratioed gate;
said ratioed gate including an output switch coupled to said location of the ratioed gate;
said first means including second means for coupling the output switch of one of said one ratioless gate and said ratioed gate to the logic block of the other of said one ratioless gate and said ratioed gate;
clock means for providing first and second clock signals with each of the clock signals having a predetermined phase relationship relative to the other;
means for coupling the output switch of said one ratioless gate to said clock means and the output switch of the ratioed gate to said clock means so that the output switches of said one ratioless gate and the ratioed gate are controlled by the first clock signal and the second clock signal, respectively; and means for coupling at least one of said first switches of said first and second ratioless gates to receive one of said first and second clock signals.

13. A logic cell as defined in claim 12 wherein said one ratioless gate is said second ratioless gate, said second means couples the output switch of the second ratioless gate to an input of the logic block of said ratioed gate, and said second means includes a third ratioless gate, and means for coupling said third ratioless gate to receive said first clock signal.

14. A logic cell as defined in claim 13 wherein both of said first switches of said first and second ratioless gates are coupled to receive said second clock signal and said second ratioless gate includes a branch between the logic block thereof and a reference potential, said branch including a control switch, and means for coupling said control switch to said clock means so that said first clock signal can control the state of said control switch.

15. A logic cell as defined in claim 12 wherein said one ratioless gate is said first ratioless gate, said second means couples the output switch of the ratioed gate to an input of the logic block of the first ratioless gate, and said second means includes a third ratioless gate.

16. A logic cell comprising:
first and second ratioless gates, each of said ratioless gates including a logic block, a switch coupled to the logic block, and a location between the switch and the logic block;
a ratioed gate including a logic block, impedance means coupled to the logic block, and a location between the impedance means and the logic block, said logic block of said ratioed gate being adapted to be coupled to a reference potential whereby the impedance means and the logic block of said ratioed gate can serve as a voltage divider and the state of the logic block of the ratioed gate affects the potential at said location of the ratioed gate;
each of said first and second ratioless gates and said ratioed gate including an output switch coupled to the location of the associated gate;
means for coupling the output switch of said first ratioless gate to an input of the logic block of said ratioed gate;
means for coupling the output switch of the ratioed gate to an input of the logic block of said second ratioless gate;
clock means for providing first and second clock signals with each of the clock signals having a predetermined phase relationship relative to the other;
means for coupling the output switch of said first ratioless gate to said clock means so that the first clock signal can control said output switch of said first ratioless gate;
means for coupling the output switch of said ratioed gate to said clock means so that the second clock signal can control the output switch of said ratioed gate; and
means for coupling the output switch of said second ratioless gate to said clock means so that one of the clock signals can control said output switch of said second ratioless gate.

* * * * *